United States Patent [19]

Lüder et al.

[11] Patent Number: 5,316,893
[45] Date of Patent: May 31, 1994

[54] METHOD OF PRODUCING ELECTRONIC SWITCHING ELEMENT

[76] Inventors: Ernst Lüder, Pfaffenwaldring 47, 7000 Stuttgart 80; Volker Hochholzer, Wiener Str. 11, 7000 Stuttgart 30, both of Fed. Rep. of Germany

[21] Appl. No.: 637,059

[22] Filed: Jan. 3, 1991

[51] Int. Cl.[5] .......................... G02F 1/03; G03F 7/00
[52] U.S. Cl. ..................................... 430/313; 430/20; 430/311; 430/318
[58] Field of Search ................. 430/20, 311, 313, 317, 430/318, 319

[56] References Cited

U.S. PATENT DOCUMENTS

| | | | |
|---|---|---|---|
| 3,867,193 | 2/1975 | Sumi | 430/313 |
| 4,058,445 | 11/1977 | Anders | 204/192.15 |
| 4,514,253 | 4/1985 | Minezaki | 430/313 |
| 4,683,183 | 7/1987 | Ono | 430/313 |
| 4,913,674 | 4/1990 | Nicholas | 430/313 |

Primary Examiner—Marion E. McCamish
Assistant Examiner—Kathleen Duda
Attorney, Agent, or Firm—Michael J. Striker

[57] ABSTRACT

A switching electrode especially for controlling image points in liquid crystal indicators has a ground electrode, a dielectric, and a counterlectrode. Parameters of the switching element are controllable in a broad region independently from one another. The production of the switching element can be easily integrated in production process of a liquid crystal indicator.

7 Claims, 2 Drawing Sheets

METHOD OF PRODUCING ELECTRONIC SWITCHING ELEMENT

BACKGROUND OF THE INVENTION

The present invention relates to a method of producing an electronic switching element composed of a ground electrode, a dielectric and a counterelectrode, and used especially for active control of image points in liquid crystals indicators, and also to a switching element produced in accordance with the method.

Liquid crystals indicators with a high image point number have as a rule a matrix shaped arrangement of image points. The individual image points are separate controllable through data conduits. With selection of predetermined image points by applying a minimum voltage level to its associated data conduit, this selection voltage is transmitted through a switching element to the electrode of the image point cell. Such a switching element can be a so-called metal-isolator-metal element or shorter MIM-element.

SUMMARY OF THE INVENTION

Accordingly, it is an object of the present invention to provide a switching element and a method of its manufacture, with which characteristic parameters of the switching element can be adjustable easily and independently from one another, and which switching element can be easily integratable into the manufacturing process of the whole liquid crystal indicator.

In keeping with these objects and with others which will become apparent hereinafter, one feature of the present invention resides, briefly stated, in a method of producing an electronic switching element of the above mentioned type which includes the following step:

structuring of the tantalum ground electrode applied on a transparent substrate in an etching process;
anodic oxidation of the tantalum ground electrode for producing a tantalum pentoxide dielectric;
first tempering of the structure in vacuum;
sputtering of the counterelectrode material;
second tempering of the structure in oxygen containing atmosphere;
structuring of an overlapping region of both electrodes by applying of a photoresist layer on the counter electrode and illuminating from the substrate rear side;
structuring of the counterelectrode in an etching process.

The object of the invention is achieved by selecting the above mentioned sequence of steps and also the counter-electrode can be composed of indium-zinc oxide (ITO).

The method of producing the switching element is distinguished especially by its two tempering steps. During the first vacuum tempering step the $Ta_2O_5$ layer loses its blocking property and is converted into a voltage dependent resistor layer. Moreover, the vacuum tempering process provides for a symmetrical current-voltage characteristic of the switching element. This is important for controlling of image points of liquid crystal indicators since the selection voltages for the image points permanently change their polarity, for avoiding a chemical decomposition of the liquid crystal. The steepness of the current-voltage characteristic line of the MIM element in permeability region is determined by the layer thickness of the dielectric. The second important parameter of the current-voltage characteristic line, the steep drop voltage $u_k$ which marks the transition from the blocking to the permeable region, can be adjusted by the second tempering process in an oxygen containing atmosphere by producing a thin oxide layer on the tantalum pentoxide dielectric.

With the preferable utilization of a counter-electrode as indium-zinc oxide (ITO), the air tempering process also acts for oxidation of the sputtered ITO layer, whereby a later structuring of the counterelectrode is possible. The steepness and the steep drop voltage of the current voltage characteristic line is adjustable over wide region independently from one another by the thickness of the dielectric at the second tempering process.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1A:
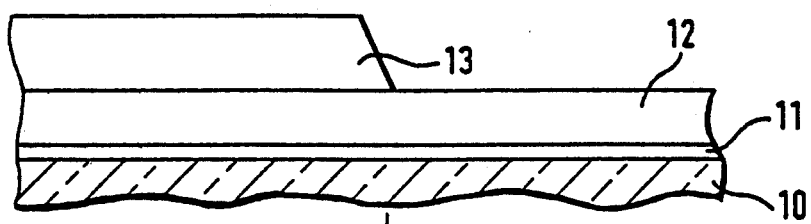
FIGS. 1a, 1b, 1c, 1d, 1e, 1f and 1g is a schematic view showing a method step sequence for producing a switching element.
Figure 1B:
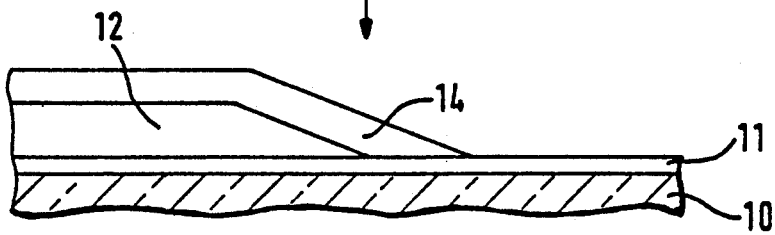
Figure 1C:
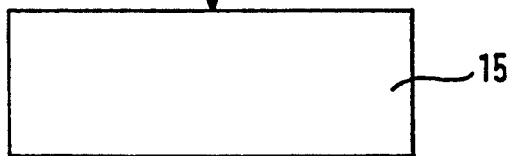
Figure 1D:
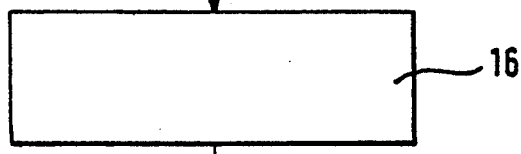
Figure 1E:
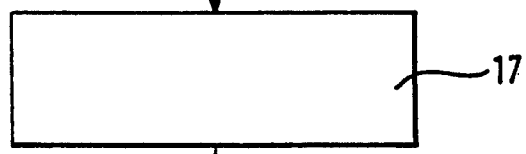
Figure 1F:
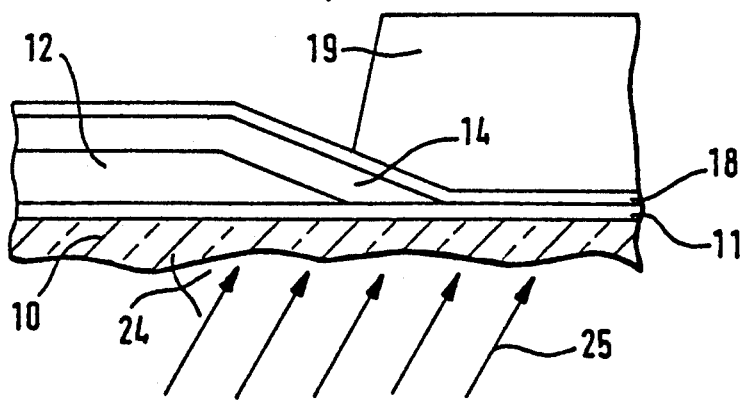
Figure 1G:
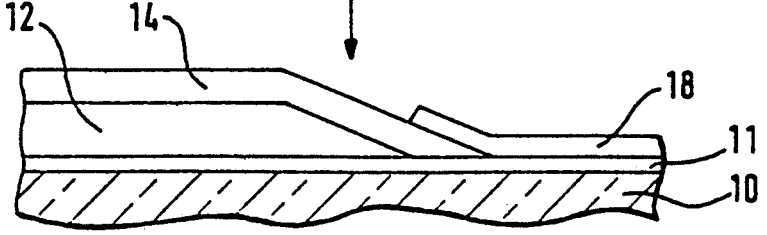

Production of an electronic switching element in accordance with the present invention is performed by a method which includes the following steps:

structuring of the tantalum ground electrode applied on a transparent substrate in an etching process;
anodic oxidation of the tantalum ground electrode for producing a tantalum pentoxide dielectric;
first tempering of the structure in vacuum;
sputtering of the counterelectrode material;
second tempering of the structure in oxygen containing atmosphere;
structuring of an overlapping region of both electrodes by applying of a photoresist layer on the counter electrode and illuminating from the substrate rear side;
structuring of the counterelectrode in an etching process.

Favorable data for the duration and the temperature of both tempering steps are recommended in the practice for the vacuum tempering process approximately 1 hour and at least 450° C., and for second tempering step approximately 1 hour at 250° C.–380° C. The second tempering step can be performed advantageously in air.

Preferably, during the structuring of the overlapping region of both electrodes in the manufacturing process of the switching element, the illumination of the photoresist layer is performed through the substrate and at an acute angle relative to the substrate. Therefore a substantially smaller overlapping region is obtained as compared with the region produced by vertical illumination through the substrate. As a result the capacity of the switching element can be maintained low. A low capacity of the control element is desirable since then the overcouple of the disturbing signals on the data lines on the electrodes of the image point is low. A further reduction possibility of the capacity of the switching element by reducing of the overlapping surface can be obtained by forming the overlap of both electrodes in a flatly extending edge region of the tantalum ground electrode.

The application of the second dielectric on the first dielectric after the first tempering step provides for a further reduction of the capacity of the switching element. The total capacity of the switching element is calculated from the series circuit of capacitors formed by both dielectrics. In a switching element with a double dielectric the layer thickness of the second dielectric substantially determines the steep drop voltage of the current-voltage line. The second tempering step in the method with two dielectrics and utilization indium-zinc oxide as a counterelectrode material, serves for oxidation of the ITO layer for later structuring of the counter electrode.

The utilization of indium-zinc oxide for the counterelectrode has the advantage, since ITO as transparent material also forms the cover electrode for the liquid crystal image points. Thereby the production of a liquid crystal indicator with MIM elements for control, in contrast to the known processes with tantalum pentoxide is possible in a two-mask process. Previously known processes with tantalum pentoxide utilized chromium or tantalum as cover electrode, whereby a third mask for producing the switching element was required.

In MIM elements with two dielectrics, the second dielectric can advantageously be a transparent material such as silicium oxide, silicium nitride or silicium oxinitride. A structuring of the second dielectric therefore can be dispensed with.

FIG. 1 under (a) shows a cross-section of a substrate 10 provided with an edge stopping layer 11, and a tantalum layer 12 applied on it. A photoresist layer 13 which partially cover the tantalum layer 12 serves for structuring of the tantalum ground electrode of the switching element in an etching process. Under (b) a section is shown through the structure after the etching process and after an anodic oxidation of the tantalum ground electrode 12 to the tantalum pentoxide layer 14 which operates as dielectric of the switching element. Under (c), a first tempering 15 of the structure in vacuum is shown. In the next method step 16 identified under (d), the sputtering of the counterlectrode material composed here preferably of indium-zinc oxide (ITO) is performed. Under (e) a tempering 17 of the structure in an oxygen containing atmosphere, for example air, is shown.

In the next method step identified under (f) the ITO counterelectrode 18 is provided with a photoresist layer 19 and illuminated through the substrate 10 with light 20. The light impingement is performed under an acute angle 24 to the lower edge of the substrate, to obtain a smallest possible overlap on both electrodes. For the photoresist layer 19 can for example the photoresist AZ 5214 E of Hoechst AG be used, which after the illumination is subjected to an image reversal process so that the illuminated areas of the photoresist does dissolve in a developed. Thereby a structuring of the overlapping region of the tantalum ground electrode 12 and the ITO counterelectrode 18 is possible. Under (g) the finished switching element is shown in section, after the etching process and washing out of the photoresist layer 12. The overlap between the counterlectrode 10 and the ground electrode 12 with dielectric 14 of tantalum pentoxide arranged therebetween is formed in the shown embodiment of the switching element in flatly extending lower edge region of the tantalum ground electrode. Thereby, a very low surface and also a very low capacity of the switching element is obtained.

Figure 2:
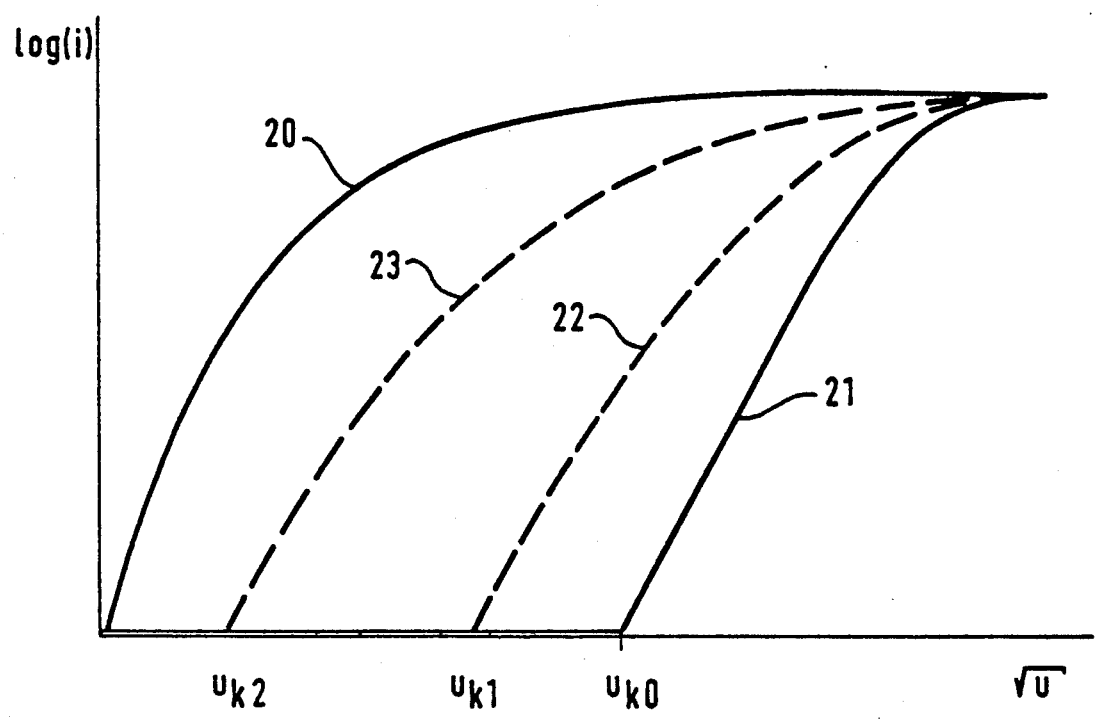
FIG. 2 is a view schematically showing current-voltage characteristic lines of a switching element.

In the diagram shown in FIG. 2 the logarithm of the current i is shown versus the root of the voltage u of the switching element. There are four current-voltage characteristic lines 20–23 in the diagram. The curve 20 shows the current-voltage characteristic line when no tempering in an oxygen-containing atmosphere is performed. The switching element has in this case a small blocking region, or in other words the steep drop voltage $u_k$ amounts to 0 volts. The curve 21 represents the characteristic line of the switching element after an air tempering at 380° C. At this temperature, the maximum possible steep drop voltage $u_{k0}$ is obtained. At lowered temperatures, the curve 22 for 280° C. and the curve 23 for 200° C. are obtained. A reduction in the temperature in the same tempering step acts for reducing the steep drop voltage $u_k$ to the value $u_{k1}$ and $u_{k2}$, without substantially influencing the steepness of the characteristic line in the permeability region. The maximum obtainable steep drop voltage $u_{k0}$ and the steepness of the characteristic line depends on the material of the dielectric and on its thickness. By varying the temperature in the second tempering step, approximately each arbitary steep drop voltage can be adjusted below the value $u_{k0}$.

The adjustment of the steep drop voltage can be performed instead of the second tempering step, also by applying a layer thickness corresponding to a second dielectric with simultaneous further reduction of the capacity of the switching element.

It will be understood that each of the elements described above, or two or more together, may also find a useful application in other types of methods differing from the types described above.

While the invention has been illustrated and described as embodied in a method of producing an electronic switching element, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A method of producing an electronic switching element including a ground electrode, a dielectric and a counterelectrode and used for active control image points in liquid crystal indicators, comprising the steps of:
   structuring in an etching process a tantalum ground electrode applied on a transparent substrate;
   anodically oxidating the tantalum ground electrode for producing a tantalum pentoxide dielectric;
   first tempering the structure in vacuum;
   sputtering a material of the counterelectrode;
   second tempering the structure in oxygen containing atmosphere;
   structuring of an overlapping region of both electrodes by first applying of a photoresist layer on the counter electrode and then illuminating through the substrate from its rear side; and structuring the counterelectrode in an etching process.

2. A method as defined in claim 1, wherein said first tempering is performed approximately one hour at minimum 450° C.

3. A method as defined in claim 1, wherein said second tempering is performed in air.

4. A method as defined in claim 3, wherein said second tempering in air is performed approximately in one hour at 250° C.-380° C.

5. A method as defined in claim 1, wherein during the structuring of the overlapping region of both electrodes the illumination of photoresist layer is performed through the substrate at an acute angle relative to the substrate.

6. A method as defined in claim 1, wherein after said first tempering, a second dielectric is deposited on the first mentioned dielectric.

7. A method of producing an electronic switching element including a ground electrode, a dielectric and a counterelectrode and used for active control image points in liquid crystal indicators, comprising the steps of:

structuring in an etching process a tantalum ground electrode applied on a transparent substrate;

anodically oxidating the tantalum ground electrode for producing a tantalum pentoxide dielectric;

first tempering the structure of the tantalum pentoxide dielectric in vacuum at a temperature of 450° C.;

sputtering a material of the counterelectrode;

second tempering the structure of the counterelectrode in air;

subsequent to the second tempering, structuring of an overlapping region of both electrodes by first applying of a photoresist layer on the counter electrode and then illuminating through the substrate from its rear side; and structuring the counterelectrode in an etching process.

* * * * *